United States Patent [19]  
Nishimori et al.

[11] Patent Number: 4,551,644  
[45] Date of Patent: Nov. 5, 1985

[54] FIELD EFFECT TRANSISTOR GATE CIRCUIT FOR ANALOG SIGNALS

[75] Inventors: Eiji Nishimori, Kawasaki; Chikara Tsuchiya, Tokyo; Yoshiaki Sano, Yokohama, all of Japan

[73] Assignee: Fujitsu Limited, Kawasaki, Japan

[21] Appl. No.: 547,236

[22] Filed: Oct. 31, 1983

[30] Foreign Application Priority Data

Nov. 2, 1982 [JP] Japan ................. 57-192952

[51] Int. Cl.$^4$ ............... H03K 17/16; H03K 17/693
[52] U.S. Cl. ........................ 307/573; 307/570; 307/554; 307/304
[58] Field of Search ............ 307/200 B, 443, 446, 307/560, 552–554, 562, 577, 570–575, 581, 584, 264, 304

[56] References Cited

U.S. PATENT DOCUMENTS

| | | | |
|---|---|---|---|
| 3,313,358 | 4/1967 | Bowers, Jr. ............... | 307/570 X |
| 3,519,852 | 7/1970 | Jennings et al. ............ | 307/570 X |
| 3,532,899 | 10/1970 | Huth et al. ................ | 307/572 |
| 3,558,921 | 1/1971 | Yokozawa et al. .......... | 307/570 X |
| 3,740,581 | 6/1973 | Pfiffner .................... | 307/570 |
| 3,902,078 | 8/1975 | Peterson ................... | 307/573 |
| 3,916,222 | 10/1975 | Compton .................. | 307/570 |
| 3,942,039 | 3/1976 | Kikuchi et al. ............. | 307/572 |
| 3,955,103 | 5/1976 | Russell et al. .............. | 307/573 |
| 4,042,836 | 8/1977 | Compton et al. ........... | 307/572 |
| 4,103,186 | 7/1978 | Albarran et al. ........... | 307/570 |

FOREIGN PATENT DOCUMENTS

| | | | |
|---|---|---|---|
| 0047128 | 4/1981 | Japan .................... | 307/571 |
| 0137730 | 10/1981 | Japan .................... | 307/571 |

Primary Examiner—Stanley D. Miller  
Assistant Examiner—D. R. Hudspeth  
Attorney, Agent, or Firm—Staas & Halsey

[57] ABSTRACT

A gate circuit for analog signals composed of field effect transistors is provided. The analog signal is switched on and off by variation of the conductance of the FETs. Distortion of the signal is a crucial problem for such circuits, which is overcome by detecting the voltages at both the source and drain sides of the switching transistor which controls the signals to be on and off, and by feeding the voltages back to the gate of the switching transistor. The inner resistance of the switching transistor when it is in the on state is reduced, and becomes symmetric at both sides of $V_{DS0}$. As a result the second order distortion is greatly reduced.

7 Claims, 6 Drawing Figures

Prior Art

FIELD EFFECT TRANSISTOR GATE CIRCUIT FOR ANALOG SIGNALS

BACKGROUND OF THE INVENTION

The present invention relates to a switching circuit for analog signals composed of field effect transistors. More precisely, it involves a gate circuit to switch analog signals ON and OFF by field effect transistors. The distortion of signals passing through the circuit is reduced by avoiding the unsymmetrical characteristics of the internal resistance when the circuit is in the ON state.

Switching of analog signals is performed generally by relays, but recently it has become important to handle analog signals by semiconductor devices. In this case, distortion of the signal becomes an important factor. Namely, the signal passing through the relay did not suffer from distortion, but when the signal passed through semiconductor devices, it suffered from distortion.

One approach to overcome this difficulty is to employ only a small signal. This is because, even if the transfer characteristic is not linear, a small signal amplitude is not distorted so much. But the need for a solid state switching device is increasing, because of its small size, quick response, small operating power, high reliability, economy and so on. Accordingly, it is required to provide for larger amplitude signals.

For switching signals, field effect transistors (FET) are widely used. But in a circuit which switches analog signals according to the ON and OFF states of a FET, the internal resistance of the FET when it is in the ON state (on-resistance) varies according to the voltage between source and drain (source-drain voltage) and the polarity of the signals, which cause distortion of the signals passing through the FET.

FIG. 1 shows an example of a prior art switching circuit for analog signals. In the figure, $J_0$ designates a p-channel type FET for switching signals, $I_D$ is a constant current source for supplying current to the gate G of the FET $J_0$ and so on. $E_K$ is a control voltage source for varying the conductivity of the FET $J_0$ and for shifting the state of $J_0$ ON and OFF.

The fundamental switching process is performed by switching the FET $J_0$ to the ON and OFF states. Namely, when the control voltage $E_K$ is high, the channel between the source S and the drain D of the FET $J_0$ is pinched off by an extended depletion layer formed by a high gate voltage, and the switch is OFF (namely, the gate is closed). On the contrary, when the control voltage $E_K$ is low, the depletion layer is narrowed, and the switch is ON (the gate is opened). Accordingly, the switching of the gate ON and OFF is determined by the low or high state of the control voltage.

A FET $J_1$ in FIG. 1 detects the source voltage of the FET $J_0$ and feeds it back to the gate G of the FET $J_0$ in order to keep the voltage between the gate and source of $J_0$ ($V_{GS0}$) constant independent of the source voltage.

The drain current of each FET has saturation characteristics as shown in FIG. 2. This shows the drain current $I_D$ against the source-drain voltage $V_{DS}$, for various values of the voltage between the gate and source (gate-source voltage), $V_{GS}$. As can be seen in the figure, the drain current has a saturation region and an unsaturation region. In the saturation region, the drain current $I_D$ can be expressed as $$I_D = I_{DSS}\left(1 - \frac{V_{GS}}{V_P}\right)^2 \quad (1)$$

wherein $V_{GS}$ is the gate-source voltage, $I_{DSS}$ is the saturation current of the drain when $V_{GS}=0$ and $V_P$ is the pinch-off voltage.

In the unsaturation region, the drain current $I_D$ is given as $$I_D = \frac{1}{R_{min}}\left\{V_{DS} - \frac{2}{3}\cdot\frac{1}{\sqrt{V_P}}[(V_{DS} + V_{GS})^{3/2} - V_{GS}^{3/2}]\right\} \quad (2)$$

wherein $V_{DS}$ is the source-drain voltage, and $R_{min}$ is the resistance between the source and drain when $V_{DS}=0$ and $V_{GS}=0$. These equations are well known in the prior art. A more detailed description is provided, for example, in *Physics of Semiconductor Devices*, published by John Wiley & Sons, Inc., N.Y., 1969.

In the circuit shown in FIG. 1, if the FET $J_1$ is operated in a saturation region in accordance with equation (1) and if its drain current is fixed by the constant current source $I_D$, then the gate-source voltage $V_{GS1}$ of the FET $J_1$ is also fixed. Thus, in the circuit of FIG. 1, when the voltage of the gate of the FET $J_1$ follows changes in the source voltage of transistor $J_0$, the bottom terminal (the negative terminal) of the control voltage source $E_K$ also follows those changes. Consequently, the top terminal of the control voltage source $E_K$ follows the changes in the source voltage of the transistor $J_0$, which means that the gate voltage of the FET $J_0$ follows those changes, thereby to maintain $V_{GS0}$ constant.

The inner resistance $R_{ON}$ between the source and drain of the transistor $J_0$ when it is in the ON (conductive) state is given by $$R_{ON} = \frac{V_{DS0}}{I_{D0}} = R_{min}\frac{V_{DS0}}{V_{DS0} - \frac{2}{3}\frac{1}{\sqrt{V_P}}[(V_{DS0} + V_{GS0})^{3/2} - V_{GS0}^{3/2}]}$$

It should be noted that equation (2) is expressed in terms of absolute value, while on the other hand, for a general p-channel FET, the gate electrode G is positively biased with respect to the source electrode S, and the drain electrode D is negatively biased ($V_{DS}$) with respect to the source electrode. Therefore, $V_{DS0}$ should be replaced in the above equation by $-V_{DS0}$. Therefore $$R_{ON} = R_{min}\frac{V_{DS0}}{V_{DS0} + \frac{2}{3}\frac{1}{\sqrt{V_P}}[(V_{GS0} - V_{DS0})^{3/2} - V_{GS0}^{3/2}]} \quad (3)$$

in which $V_{DS0}<0$.

In the case of $V_{DS0}>0$, that is, wherein the drain voltage is higher than the source voltage, the drain current $I_D$ of the p-channel FET is controlled by the gate-drain voltage $V_{GD}$. The direction of $I_{D0}$ is reversed. Therefore in this case $V_{GS0}$, $V_{DS0}$ and $I_{D0}$ of the foregoing equations should be replaced by $V_{GD0}$, $-V_{DS0}$ and $I_{D0}$ respectively. So, from the equation above equation (3)

$$R_{ON} = R_{min} \frac{-V_{DS0}}{-V_{DS0} - \frac{2}{3} \cdot \frac{1}{\sqrt{V_P}} [(-V_{DS0} + V_{GD0})^{3/2} - V_{GD0}^{3/2}]}$$

With the same reasoning as for equation (3), in order to express the equation using a positive value of $V_{DS0}$, it is necessary to replace $-V_{DS0}$ by $V_{DS0}$. So the equation above becomes $$R_{ON} = R_{min} \frac{V_{DS0}}{V_{DS} - \frac{2}{3} \frac{1}{\sqrt{V_P}} [(V_{DS0} + V_{GD0})^{2/3} - V_{GD0}^{3/2}]} \quad (4)$$

As has been noted above, $V_{GS0}$ is a constant, $$V_{GD0} = V_{GS0} - V_{DS0}$$

Introducing this relation into equation (4), $R_{ON}$ is given as $$R_{ON} = R_{min} \frac{V_{DS0}}{V_{DS0} + \frac{2}{3} \frac{1}{\sqrt{V_P}} [(V_{GS0} - V_{DS0})^{3/2} - V_{GS0}^{3/2}]} \quad (5)$$

This is the same equation as equation (3). So, the equation (3) can be applied not only for the negative value of $V_{DS0}$, but also for all values of $V_{DS0}$ regardless of whether its sign is + or −. In FIG. 3, the curve A shows the above relation of equation (5), under a condition of $|V_p| > |V_{GS}|$, and $|V_p| > |V_{GD}|$. As can be seen in the figure, in the region of $V_{DS} < 0$, $R_{ON}$ increases. In the region of $V_{DS} > 0$, $R_{ON}$ decreases compared to the value at $V_{DS} = 0$, showing asymmetric characteristics. For the curve A of FIG. 3, equation (5) was calculated in a condition of $V_p = 1.5$ volt, $V_{GS0} = 0.8$ volt. The asymmetric characteristics of $R_{ON}$ causes the asymmetric characteristics of current and voltage of signals passing through the FET, and that causes the distortion.

SUMMARY OF THE INVENTION

An object of the present invention, therefore, is to provide a gate circuit composed of field effect transistors whose distortion is reduced.

Another object of the present invention is to provide a gate circuit composed of field effect transistors whose internal resistance between the source and drain, when it is in the ON state ($R_{ON}$), is small and symmetric with respect to the source-drain voltage ($V_{DS}$), thus reducing the second order distortion.

The foregoing objects are accomplished by detecting voltage not only from the source side but also from the drain side of a switching transistor and feeding it back properly to the gate of the transistor. By such feedback the resistance of the switching transistor becomes small and symmetric with respect to the zero point of source-drain voltage.

The effects of the present invention will become clear from the accompanying drawings and the following detailed description.

DETAILED DESCRIPTION OF THE PREFERRED EMBODIMENTS

Figure 1:
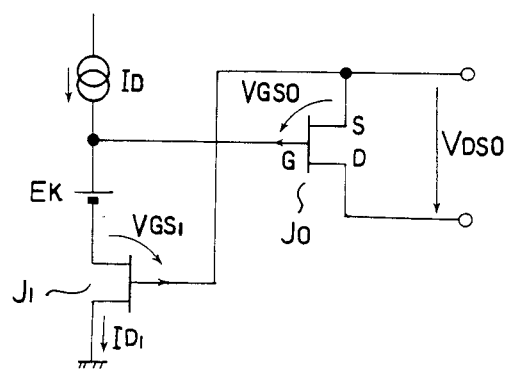
FIG. 1 is a circuit diagram indicating a prior art switching circuit composed of field effect transistors.
Figure 4:
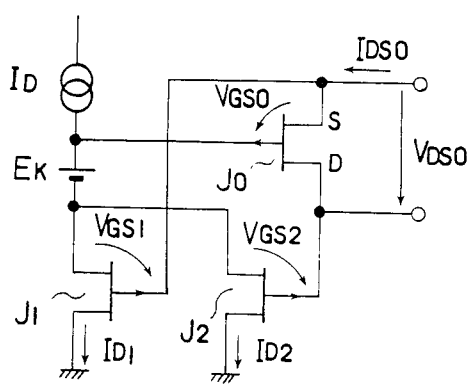
FIG. 4 is a circuit diagram indicating a switching circuit according to the present invention.

FIG. 4 shows an important part of a switching circuit of the present invention. In comparison to FIG. 1, another FET $J_2$ is added which detects the drain voltage of the FET $J_0$ and corrects the gate voltage of the FET $J_0$. In this circuit, the FET $J_0$ is required to have a symmetrical characteristic of its source-drain current with respect to its source-drain voltage, when the polarity of the latter voltage is reversed, that is, when the connections to the source and drain electrode are interchanged. It is well known that conventional FETs usually have symmetrical characteristics.

In the circuit as shown in FIG. 4, when the absolute value of the source-drain voltage $V_{DS0}$ of the FET $J_0$ is high, the gate voltage of the FET $J_0$ is mainly controlled by the one of the FETs $J_1$ or $J_2$ whose gate is connected to the lower voltage side of the FET $J_0$. Because each of the source and drain electrodes of the FETs $J_1$ and $J_2$ are commonly connected to the control voltage source $E_K$ and to ground, respectively, the transistor whose gate is connected to the higher voltage will be pinched off, and the transistor whose gate is connected to the lower voltage controls the gate of the FET $J_0$. In the case wherein $V_{DS0}$ is not so high, the situation is almost the same, and the FET $J_0$ is mainly controlled by the one of the FETs $J_1$ or $J_2$ whose gate voltage is connected to the lower voltage.

Namely, when $V_{DS0}$ is sufficiently less than 0 volts, that is, when the voltage of the drain D is sufficiently lower than that of the source S, the FET $J_0$ is controlled by the FET $J_2$. In this case, the FET $J_1$ can be neglected because it is pinched off. The FET $J_2$ is made conductive and the current running through the FET $J_2$ is the constant current $I_D$. Accordingly, $V_{GS2}$ is constant, independent of the gate voltage. Thus the gate voltage $V_{GS0}$ of the FET $J_0$ becomes lower than its value when $V_{DS0} = 0$, because the drain voltage is lower than the voltage of the source. The resistance $R_{ON}$ between the source and drain decreases to lower than its value when $V_{DS} = 0$. This will be understood from FIG. 2, which shows the characteristics of a FET. As $V_{GS}$ decreases in FIG. 2, the curves shift to that of $V_{GS} = 0$, and the increment of the curve in the unsaturated region becomes steep. Accordingly, the differential conductance increases and, thus, $R_0$ (the inverse of conductance) decreases.

On the contrary, when $V_{DS0}$ is sufficiently greater than 0 volts, that is, when the drain D has a sufficiently higher voltage than the source S, the FET $J_1$ controls the FET $J_0$. In this case, by the aforementioned symmetrical characteristics of the FET $J_0$, the situation is the same except that the source and drain of the FET $J_0$ are interchanged with each other. Thus, the resistance $R_0$ again decreases as shown by the curve B in FIG. 3.

Switching from the FET $J_1$ to the FET $J_2$, or vice versa, to control the main switching transistor $J_0$, does not occur promptly at the point $V_{DS0}=0$. There is a region in which both FETs $J_1$ and $J_2$ are operative, wherein they both control $J_0$ together. In general, the circuit of the present invention is operable in such a condition as indicated by equation (6) below.

Figure 2:
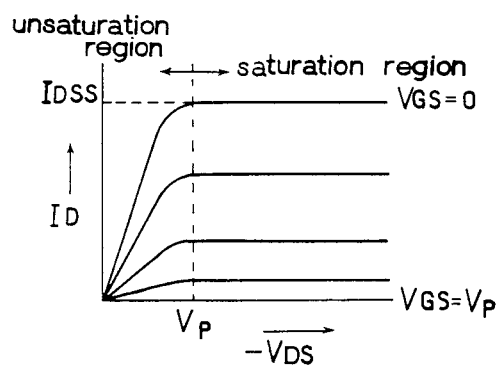
FIG. 2 is a graph showing the static characteristics of a field effect transistor.
Figure 3:
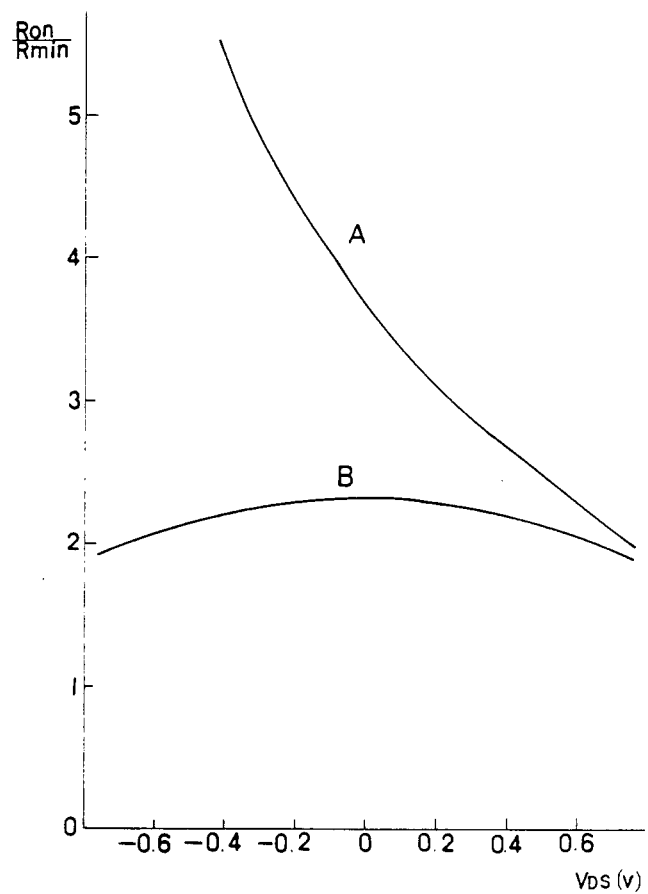
FIG. 3 is a graph showing calculated ON state resistances for comparing a prior art circuit and a circuit according to the present invention.

Consider the case where the FETs $J_1$ and $J_2$ are both active (in the ON state), and let the FET $J_1$ be more active than $J_2$, that is, let the FET $J_1$ play a major part in controlling the FET $J_0$. In such a case, the drain current $I_{D1}$ through the FET $J_1$ becomes smaller than $I_D$ (because the constant current $I_D$ is shared by $J_2$, as shown in equation (6) below), and $V_{GS1}$ shifts to a larger value, as can be seen in FIG. 2. Therefore, $V_{GS0}$ shifts to a lower level compared to the case where the FET $J_2$ is not working (is pinched off). Because $V_{GS0}=E_K-V_{DS1}$, as $I_{D0}$ becomes larger, $R_{ON}$ becomes smaller compared the value when the FET $J_2$ is not working. Therefore, the curve B in FIG. 3, is lower than the curve A. Similar comments apply when the FET $J_2$ is more active than the FET $J_1$.

The right hand region of FIG. 3, far away from the center line of $V_{DS}=0$, shows where the curve B approaches to the curve A gradually. When the FET $J_2$ is perfectly pinched off, the two curves coincide with each other, that is, $I_{D0}$ is expressed by equation (3). The situation when the FETs $J_1$ and $J_2$ both actively control $J_0$ is expressed by the equation (11) corresponding to the curve B in FIG. 3.

The above performance can be analyzed by the help of some equations. For the sake of simplicity, it is assumed that $R_{min}$, $I_{DSS}$ and $V_P$ are the same for each of the FETs $J_1$. Since the circuit is operated by a constant current source $I_D$, and since the value of the constant current is the sum of the two drain currents, $I_{D1}$ and $I_{D2}$, equation (1) yields $$I_{DSS}\left(1 - \frac{V_{GS1}}{V_P}\right)^2 + I_{DSS}\left(1 - \frac{V_{GS2}}{V_P}\right)^2 = I_D \tag{6}$$

and the relation $$V_{DS0} = V_{GS2} - V_{GS1} \tag{7}$$

The on-state resistance $R_{ON}$ between the source and drain of the FET $J_0$ is given by $$R_{ON} = V_{DS0}/I_{D0}$$

which becomes, when substituting according to equation (2), $$R_{ON} = R_{min} \frac{V_{DS0}}{V_{DS0} - \frac{2}{3}\frac{1}{\sqrt{V_P}}[(V_{DS0} + V_{GS0})^{3/2} - V_{GS0}^{3/2}]}$$

It should be noted that equation (2) is expressed with absolute value, so that for a general p-channel FET, $V_{GS}$ is positively biased and $V_{DS}$ is negatively biased. Accordingly, it is necessary to replace $V_{DS0}$ in the above equation by $-V_{DS0}$. Therefore $$R_{ON} = R_{min} \frac{V_{DS0}}{V_{DS0} + \frac{2}{3}\frac{1}{\sqrt{V_P}}(V_{GS0} - V_{DS0})^{3/2} - V_{GS0}^{3/2}} \tag{8}$$

Substituting equation (7) into equation (6) for eliminating $V_{GS2}$ yields $$V_{GS1} = V_P - \frac{V_{DS0}}{2} \pm \sqrt{\tfrac{1}{2}V_P^2 \frac{I_D}{I_{DSS}} - \tfrac{1}{4}V_{DS0}^2}$$

wherein the solution with the $-$ sign of the $\pm$ term should be chosen, because, $V_{GS}$ should be larger than $V_P$ for $V_{DS0}=0$. Therefore $$V_{GS1} = V_P - \frac{V_{DS0}}{2} - \sqrt{\tfrac{1}{2}V_P^2 \frac{I_D}{I_{DSS}} - \tfrac{1}{4}V_{DS0}^2} \tag{9}$$

Since $$V_{GS0} = E_K - V_{GS1} \tag{10}$$

by substituting equations (10) and (9) into equation (8), $R_{ON}$ can be expressed as a function of $V_{DS0}$, namely $$R_{ON} = R_{min} \cdot V_{DS0} / \left\{ V_{DS0} + \tfrac{2}{3}\frac{1}{\sqrt{V_P}}\left[\left(E_K - V_P - \frac{V_{DS0}}{2} + \sqrt{\tfrac{1}{2}V_P^2\frac{I_D}{I_{DSS}} - \tfrac{1}{4}V_{DS0}^2}\right)^{3/2} - \left(E_K - V_P + \frac{V_{DS0}}{2} + \sqrt{\tfrac{1}{2}V_P^2\frac{I_D}{I_{DSS}} - \tfrac{1}{4}V_{DS0}^2}\right)^{3/2}\right]\right\} \tag{11}$$

In FIG. 3, curve B shows the characteristic of $R_{ON}$ corresponding to the circuit of FIG. 4 according to equation (11). In the figure it is assumed that $V_p=1.5$ volt, $V_{GS0}=0.8$ volt ($V_{DS0}=0$), $I_D/I_{DSS}=0.5$ (namely, $V_{GS1}=V_{GS2}=0.44$ volts and $V_{DS0}=0$) and $E_K=1.24$ volt. As can be seen in the figure, $R_{ON}$ decreases on both sides of $V_{DS}=0$, regardless of the polarity of the source-drain voltage.

Figure 5:
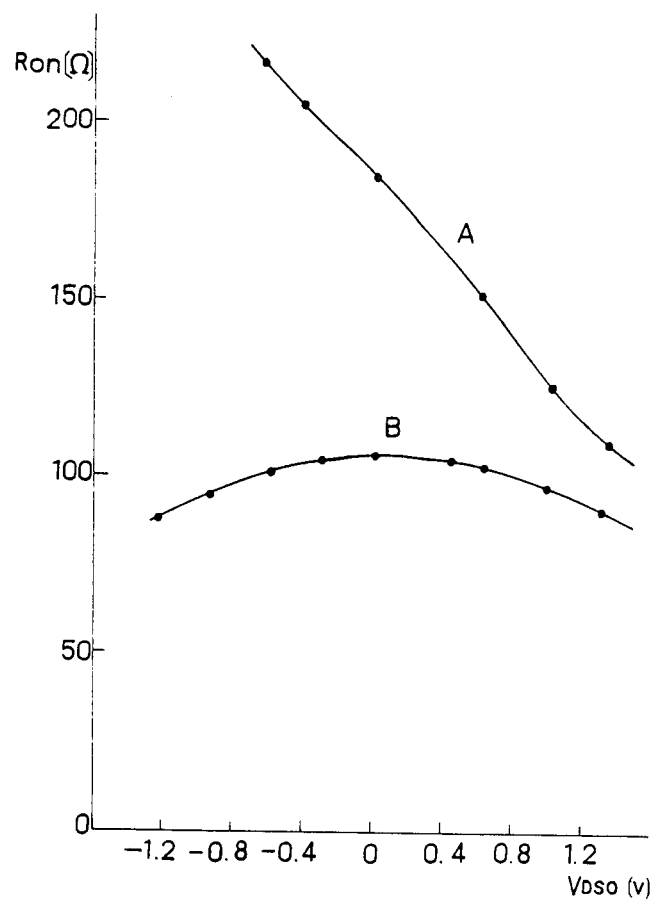
FIG. 5 is a graph showing measured ON state resistance for comparing a prior art circuit and a circuit according to the present invention.

FIG. 5 shows examples of measured values of $R_{ON}$ as a function of the amplitude of $V_{DS}$, which correspond to FIG. 3. In the figure, the curve A is a measured value for a prior art circuit, and the curve B is a measured value for a circuit of the present invention. As can be seen in the figure, the present invention shows a drastic improvement, and it is seen to have good agreement with analysis. The resistance $R_{ON}$ in the present invention is much smaller than that of the prior art. Moreover, the curve B has a gentle slope compared to curve A, and it is symmetric with respect to both polarities of $V_{DS}$. Accordingly, the distortion caused by the inner resistance of the circuit is reduced. Especially, the second order distortion is reduced to a great extent.

The disclosure of the present invention has been carried on with respect to a circuit composed from p-channel type FETs. But it will be clear from the prior art that it can be extended to a circuit composed of n-channel type FETs by reversing the polarity of the voltage applied to each part of the circuit. It will be also clear that the present invention can be applied to any kind of field effect transistors such as MOS (metal oxide semiconductor) type or junction type FETs. For the sake of simplicity, the description hereinafter will be carried on with respect to p-channel FETs.

Figure 6:
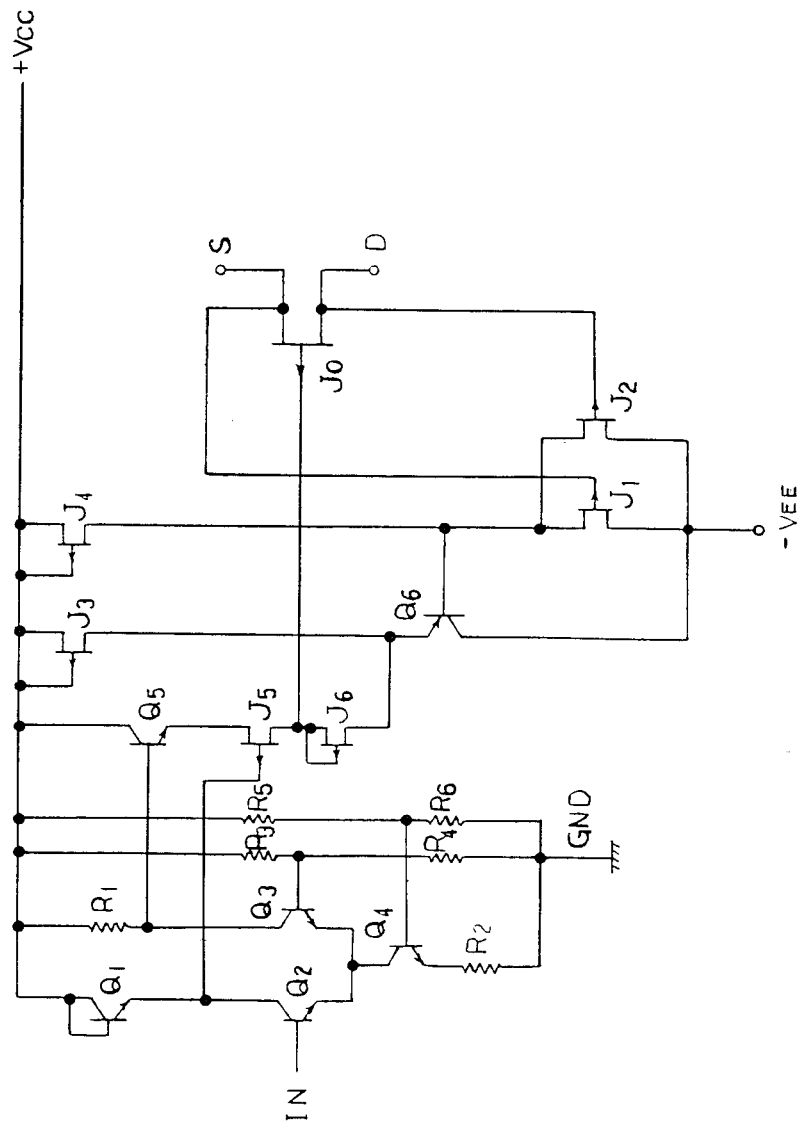
FIG. 6 is a circuit diagram for one embodiment of the present invention.

FIG. 6 shows a circuit diagram for an example of a switching circuit of the present invention. In FIG. 6, $J_0$ to $J_2$ designate field effect transistors which form a switching circuit as shown in FIG. 4. $J_3$ to $J_6$ are FETs, $Q_1$ to $Q_5$ and $Q_6$ are of respectively opposite types (such as npn and pnp, respectively), and $R_1$ to $R_6$ are resistors. Transistors $J_5$, $J_6$ and $Q_6$ work to generate the control voltage corresponding to $E_K$ in FIG. 4. Since the gate and source electrodes of each of the FETs $J_3$ and $J_4$ are shorted together, they operate in the saturation regions, so that they work as a constant current source. The FET $J_3$ works as a current source of $E_K$. The FET $J_4$ corresponds to the constant current source $I_D$ in FIG. 4. The resistors $R_3$ and $R_4$ divide the source voltage $V_{CC}$ to supply the base bias voltage of the transistor $Q_3$. Similarly, the resistors $R_5$ and $R_6$ supply the base voltage of the transistor $Q_4$ dividing the voltage $V_{CC}$. The other transistors and resistors constitute a circuit to effectively provide the control voltage $E_K$ of FIG. 4.

An analog signal applied between the terminals S and D is gated on and off by a control signal applied to the input terminal IN. The input control signal may be any type of ON-OFF signal, such as the output signal of a logic circuit, for example.

The operation of the circuit is as follows. When the switching signal applied to the terminal IN is at low level, the emitter coupled transistor $Q_2$ is OFF, $Q_3$ is ON, and current runs through the resistor $R_1$. The circuit constants are selected to keep the voltage drop across the resistor $R_1$ higher than the pinch-off voltage of the FET $J_5$. Thus the FET $J_5$ is cut OFF and current does not flow through the FET $J_6$. Moreover, the gate and source of the FET $J_6$ are shorted to each other, and voltage drop in the transistor $J_6$ is almost zero. In this case, the effective control voltage corresponding to $E_K$, which controls the gate of the FET $J_0$, falls down to the base-emitter voltage $V_{BE}$ of the transistor $Q_6$ (approximately 0.7 V), and the switching transistor $J_0$ becomes conductive. Thus, the analog signal applied to the terminals S and D is conducted (the gate is opened).

When the control signal applied to the terminal IN in FIG. 6 is at high level, on the contrary, the transistor $Q_2$ is ON, the transistor $Q_3$ is OFF, and the voltage drop of the resistor $R_1$ becomes negligible. The transistors $Q_5$ and $J_5$ become conductive. The transistor $Q_1$, which is an npn transistor similar to the npn transistor $Q_5$, has its base connected to its collector, and works as a diode to provide the same voltage drop as that of the transistor $Q_1$ when the FET $J_5$ is ON (conductive). Thus, the gate-source voltage of the FET $J_5$ is almost 0, and the FET $J_5$ becomes conductive. The transistors $J_5$ and $J_6$ are selected beforehand, so as to cause the saturation current $I_{DSS}$ of the FET $J_5$ to be much larger than that of the FET $J_6$, for example about 10 times larger. Thus, in this case, the FET $J_5$ is operated in the unsaturated region, and the FET $J_6$ is operated in the saturated region. Further, the drain-source voltages $V_{DS}$ of the FETs $J_5$ and $J_6$ become respectively $V_{DS5} < V_P$ and $V_{DS6} > V_P$. Therefore, the gate voltage of the FET goes up almost to the voltage of $V_{CC}$, and it does not depend on the voltage of the transistor $Q_6$. Thus, the gate transistor $J_0$ is pinched off, and the analog signal applied between the terminals S and D is choked off (gate is closed). The selection of the FETs $J_5$ and $J_6$ is not critical, since it is enough if the saturation current of the FET $J_6$ is less than a quarter than that of the FET $J_5$.

The switching circuit for an analog signal is operated in the above manner. The circuit shown in FIG. 6 is an example of an embodiment of the present invention. Many other circuits within the scope of the present invention will be apparent to a skilled worker in the art in possession of the present disclosure.

It is seen in the circuit of FIG. 4, that the drain electrodes of the FETs $J_1$ and $J_2$ are connected to a negative voltage $-V_{EE}$. By doing so, the circuit is intended to operate both for positive and negative analog signals. The ground voltage is used as a reference voltage of the logic circuit.

As described in the present disclosure, the gate circuit of the present invention detects the voltage not only from the source but also from the drain side of the switching FET, and provides a feed-back to correct the drain voltage. Thus the variation of its ON state resistance is decreased and, moreover, the ON state resistance varies symmetrically with respect to positive and negative voltages, so that the second order distortion is improved to a great extent.

As has been stated above, the invention has been disclosed with respect to p-channel FETs, but it will be clear to a skilled worker in the art that the present invention applies to n-channel FETs, merely by reversing the polarity of the applied voltages. It can also be applied to MOS type, junction type on any other kind of field effect transistors.

We claim:

1. A field effect transistor gate circuit for analog signals comprising:
   a first field effect transistor (FET) for switching ON and OFF an input signal;
   a control voltage source for applying a control voltage for varying the gate voltage of said first FET and for controlling the conductance of said first FET;
   a second FET for detecting the source voltage of said first FET and for keeping a variation of voltage between the gate and source of said first FET small when said first FET is in a conductive state;
   a third FET for detecting the drain voltage of said first FET and for keeping a variation of voltage between the gate and drain of said first FET small when said first FET is in a conductive state; and
   a constant current source for supplying a constant current to said second and third FETs.

2. The circuit of claim 1, comprising:
   said control voltage source being supplied between the gate electrode of said first FET and the source electrodes of each of said second and third FETs;
   the source electrode of said first FET being operatively connected to the gate electrode of said second FET;
   the drain electrode of said first FET being operatively connected to the gate electrode of said third FET;
   said input signal being applied across said source and drain electrodes of said first FET;
   said control voltage source having first and second terminals, and the gate electrode of said first FET being operatively connected to said constant current source and to a first terminal of said control voltage source and the source electrode of said second and third FETs being operatively connected to the second terminal of said control voltage source; and said drain electrodes of said second and third FETs being operatively connected to ground.

3. The circuit of claim 2, further comprising a circuit voltage source for supplying voltage to the circuit, a bias voltage source supplying a bias voltage opposite in polarity to the voltage of said circuit voltage source, and the drain electrodes of each of said second and third FETs being operatively grounded through said bias voltage source.

4. The circuit of claim 1, 2 or 3, said first FET having a symmetric characteristic of the drain current with respect to the source-drain voltage.

5. The circuit of claim 2, including a circuit voltage source for supplying voltage to the circuit, wherein said first, second and third FETs are p-channel FETs, and said control voltage source comprises:

a fourth p-channel FET, the gate electrode of which is supplied with a control signal, and the drain electrode of said fourth p-channel FET being connected to the gate electrode of said first FET;

an npn transistor having its base electrode supplied with a signal of the opposite phase with respect to the control signal supplied to the gate of said fourth FET, the emitter electrode of said npn transistor being connected to the source electrode of said fourth FET, the collector electrode of said npn transistor being connected to said circuit voltage source;

a fifth p-channel FET having a saturation drain current of less than a quarter of that of said fourth FET, said fifth p-channel FET being connected in series to said drain electrode of said fourth FET, and having its gate electrode connected to its source electrode; and a pnp transistor having its emitter connected to the drain of said fifth FET, its collector connected to the drain electrodes of said second and third FETs, and its base connected to said source electrodes of each of the second and third FETs.

6. The circuit of claim 5, wherein said p-channel FETs, and npn and pnp transistors are replaced respectively by n-channel FETs, a pnp transistor and an npn transistor, and the polarities of said control voltage and said constant current are reversed.

7. The circuit of claim 5, wherein the amplitude of the input signal is controlled to a specified level, while a buffer effect is provided for the input signal source.

* * * * *

UNITED STATES PATENT AND TRADEMARK OFFICE
CERTIFICATE OF CORRECTION

PATENT NO. :   4,551,644
DATED      :   5 Nov. 1985
INVENTOR(S) :  Eiji Nishimori et al It is certified that error appears in the above-identified patent and that said Letters Patent is hereby corrected as shown below:

Front Page - U. S. Patent Documents

[56] "3,313,358" should be --3,313,958--.

[57] ABSTRACT, line 11, "$V_{DSO}$" should be --$V_{DS}=0$--.

Column 6, line 2 "$2/\sqrt{VP}$" should be --$1/\sqrt{VP}$--.

Column 8, line 11 "ivention" should be --invention--;
line 33 "on" should be --or--.

Signed and Sealed this

First Day of April 1986

[SEAL]

Attest:

DONALD J. QUIGG

Attesting Officer

Commissioner of Patents and Trademarks